United States Patent
Jung et al.

(10) Patent No.: US 11,043,647 B2
(45) Date of Patent: Jun. 22, 2021

(54) QUANTUM DOT FILM HAVING POROUS STRUCTURE AND MANUFACTURING METHOD FOR THE SAME

(71) Applicant: KOREA ADVANCED INSTITUTE OF SCIENCE AND TECHNOLOGY, Daejeon (KR)

(72) Inventors: Yeon Sik Jung, Daejeon (KR); Duk Young Jeon, Daejeon (KR); Geon Yeong Kim, Daejeon (KR); Jin Young Choi, Daejeon (KR); Chul Hee Lee, Daejeon (KR); Hun Hee Lim, Daejeon (KR)

(73) Assignee: KOREA ADVANCED INSTITUTE OF SCIENCE AND TECHNOLOGY, Daejeon (KR)

(*) Notice: Subject to any disclaimer, the term of this patent is extended or adjusted under 35 U.S.C. 154(b) by 0 days.

(21) Appl. No.: 16/212,798

(22) Filed: Dec. 7, 2018

(65) Prior Publication Data
US 2019/0379001 A1 Dec. 12, 2019

(51) Int. Cl.
*H01L 51/50* (2006.01)
*H01L 51/00* (2006.01)

(52) U.S. Cl.
CPC ........ *H01L 51/502* (2013.01); *H01L 51/0003* (2013.01); *H01L 51/0035* (2013.01); *Y10S 977/774* (2013.01)

(58) Field of Classification Search
CPC ............. H01L 51/502; H01L 51/0035
See application file for complete search history.

(56) References Cited

U.S. PATENT DOCUMENTS

| | | | |
|---|---|---|---|
| 2013/0293884 A1* | 11/2013 | Lee ............... | G01N 21/01 356/301 |
| 2013/0345458 A1* | 12/2013 | Freeman ........ | C08G 77/388 556/12 |
| 2017/0186922 A1* | 6/2017 | Kim ............... | C09K 11/703 |
| 2017/0225141 A1* | 8/2017 | Schotten ........ | B01J 13/02 |
| 2017/0321114 A1* | 11/2017 | Kamo ............. | C09D 201/00 |

FOREIGN PATENT DOCUMENTS

| | | |
|---|---|---|
| KR | 10-2011-0106176 | 9/2011 |
| KR | 10-2014-0054535 | 5/2014 |
| KR | 10-2017-0044052 | 4/2017 |
| KR | 10-2017-0066782 | 6/2017 |
| KR | 10-2018-0018891 | 2/2018 |
| KR | 10-2018-0043748 | 4/2018 |

OTHER PUBLICATIONS

Albrecht et al, Ultrahigh-Density Nanowire Arrays Grown in Self-Assembled Diblock Copolymer Templates, Dec. 15, 2000, Science, vol. 290, pp. 2126-2129. (Year: 2000).*
Office Action dated Dec. 19, 2019 corresponding to Korean Application No. 10-2018-0066675, 5 pages.
Notice of Allowance dated Dec. 23, 2020 corresponding to Korean Application No. 10-2018-0066675, 2 pages.

* cited by examiner

*Primary Examiner* — Fernando L Toledo
*Assistant Examiner* — Valerie N Newton

(57) ABSTRACT

The present disclosure relates to a quantum dot film including a self-assembled block copolymer, and a quantum dot bonded to the block copolymer, wherein the film has pores with an average diameter of 100-3000 nm inside.

14 Claims, 6 Drawing Sheets

QUANTUM DOT FILM HAVING POROUS STRUCTURE AND MANUFACTURING METHOD FOR THE SAME

CROSS-REFERENCE TO RELATED APPLICATION

This application claims priority of Korean Patent Application No. 10-2018-0066675, filed on Jun. 11, 2018, in the KIPO (Korean Intellectual Property Office), the disclosure of which is incorporated herein entirely by reference.

BACKGROUND OF THE INVENTION

Field of the Invention

The present disclosure relates to a quantum dot film having a porous structure and a method for manufacturing the same, more particularly to a quantum dot film exhibiting superior luminous efficiency by having pores of predetermined size inside a quantum dot-block copolymer film and a method for manufacturing the same.

Description of the Related Art

A quantum dot is a material having a crystal structure with a size of several nanometers and consists of hundreds or thousands of atoms. A semiconductor light-emitting quantum dot is a material absorption and emission wavelengths of which can be controlled by the quantum confinement effect whereby the energy bandgap of the material is increased as the material size is decreased to nano sizes or smaller. When used for a display, it exhibits higher color gamut (NTIS, 110%) than the existing LCD (70%) and exhibits performance comparable to that of an OLED. In addition, the existing LCD process can be utilized. Therefore, development into a material for next-generation displays replacing OLEDs is being accelerated with the advantages of high process yield, low production cost and long lifetime due to higher stability as compared to organic materials.

The photoluminescence quantum yield of the light-emitting quantum dot material itself is superior with 90% or higher as compared to that of the reference material. However, when it is prepared into a film, the yield is decreased due to photoluminescence quenching caused by fluorescence resonance energy transfer (FRET) between randomly arranged adjacent light-emitting quantum dots. In order to reduce photoluminescence quenching, the energy transfer between the light-emitting quantum dots may be decreased by increasing the distance between the light-emitting quantum dots. The energy transfer may be decreased by controlling the length of an alkyl group introduced for the dispersibility of the quantum dots. However, for quantum dot light-emitting diodes, there is a problem that charge transfer to the quantum dots is limited because the introduced alkyl group acts as an insulator.

For quantum dot-polymer composite-based light-emitting devices, although the luminous efficiency is superior as the quantum dots are dispersed uniformly in the polymer matrix, it is difficult to uniformly disperse the quantum dots in the polymer matrix because the quantum dots and the polymer are not compatible with each other.

Recently, researches are being carried out actively on changing the electrical and optical properties of a quantum dot by providing specific functionality with a ligand. For example, Korean Patent Publication No. 10-2011-0106176, published on Sep. 28, 2011, discloses a quantum dot-block copolymer hybrid formed by coordinating a block copolymer having a sulfur-containing functional group with a quantum dot. Korean Patent Publication No. 10-2018-0018891, published on Feb. 22, 2018, discloses a quantum dot-polymer composite wherein quantum dots having an organic ligand on the surface are dispersed in a polymer matrix. However, they are still unsatisfactory in terms of quantum dot luminous efficiency.

SUMMARY OF THE INVENTION

The present disclosure is directed to providing a quantum dot film having superior luminous efficiency (QDEF: quantum dot enhancement film) and a method for manufacturing the same.

The present disclosure provides a quantum dot film containing: a self-assembled block copolymer; and a quantum dot bonded to the block copolymer, wherein the film has pores with an average diameter of 100-3000 nm inside.

In an exemplary embodiment of the present disclosure, the self-assembled block copolymer may be an amphiphilic diblock copolymer.

In an exemplary embodiment of the present disclosure, the self-assembled block copolymer may be polystyrene-block-poly(4-vinylpyridine) (PS-b-P4VP).

In an exemplary embodiment of the present disclosure, the quantum dot may be a $CuInS_2/ZnS$ core-shell structure.

In an exemplary embodiment of the present disclosure, the quantum dot may be substituted with a ligand containing an —OH group.

In an exemplary embodiment of the present disclosure, the pores may be provided in the film by spin-coating a quantum dot-block copolymer mixture solution under a controlled humidity condition.

In an exemplary embodiment of the present disclosure, the humidity condition may be 30-80% relative humidity.

The present disclosure relates to a method for manufacturing a quantum dot film, including: (i) a step of preparing a quantum dot and a block copolymer; (ii) a step of preparing a quantum dot substituted with a ligand containing an —OH group by reacting the quantum dot with a compound containing an —OH group; (iii) a step of preparing a mixture solution of the ligand-substituted quantum dot and the block copolymer and bonding the quantum dot to the block copolymer; and (iv) a step of forming a quantum dot film by spin-coating the mixture solution on a substrate under a controlled humidity condition.

In an exemplary embodiment of the present disclosure, the block copolymer may be a diblock copolymer dissolved in a solvent.

The diblock copolymer may be an amphiphilic diblock copolymer.

The diblock copolymer may be polystyrene-block-poly(4-vinylpyridine) (PS-b-P4VP).

The solvent may selectively dissolve only one of the two blocks contained in the diblock copolymer.

In an exemplary embodiment of the present disclosure, the quantum dot may be a $CuInS_2/ZnS$ core-shell structure.

In an exemplary embodiment of the present disclosure, a ratio of the quantum dot and the block copolymer in the quantum dot-block copolymer mixture solution may be 1:2-7.

In an exemplary embodiment of the present disclosure, a bond between the quantum dot and the block copolymer may be a hydrogen bond.

In an exemplary embodiment of the present disclosure, the humidity condition may be 30-80% relative humidity.

The present disclosure also provides a quantum dot display containing the quantum dot film.

The quantum dot film of the present disclosure, wherein the quantum dot is bonded to the block copolymer with a porous structure, is advantageous in that the travelling time of incident light is increased due to the scattering effect of the porous structure and quantum dot luminous efficiency is enhanced as the dispersibility of the quantum dot is increased to micro- and nano-scales.

The quantum dot film of the present disclosure may be applied to quantum dot displays, sensors, solar cells, lightings, etc. because it can realize high luminous efficiency and superior color as a quantum dot enhancement film (QDEF).

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figure 1:
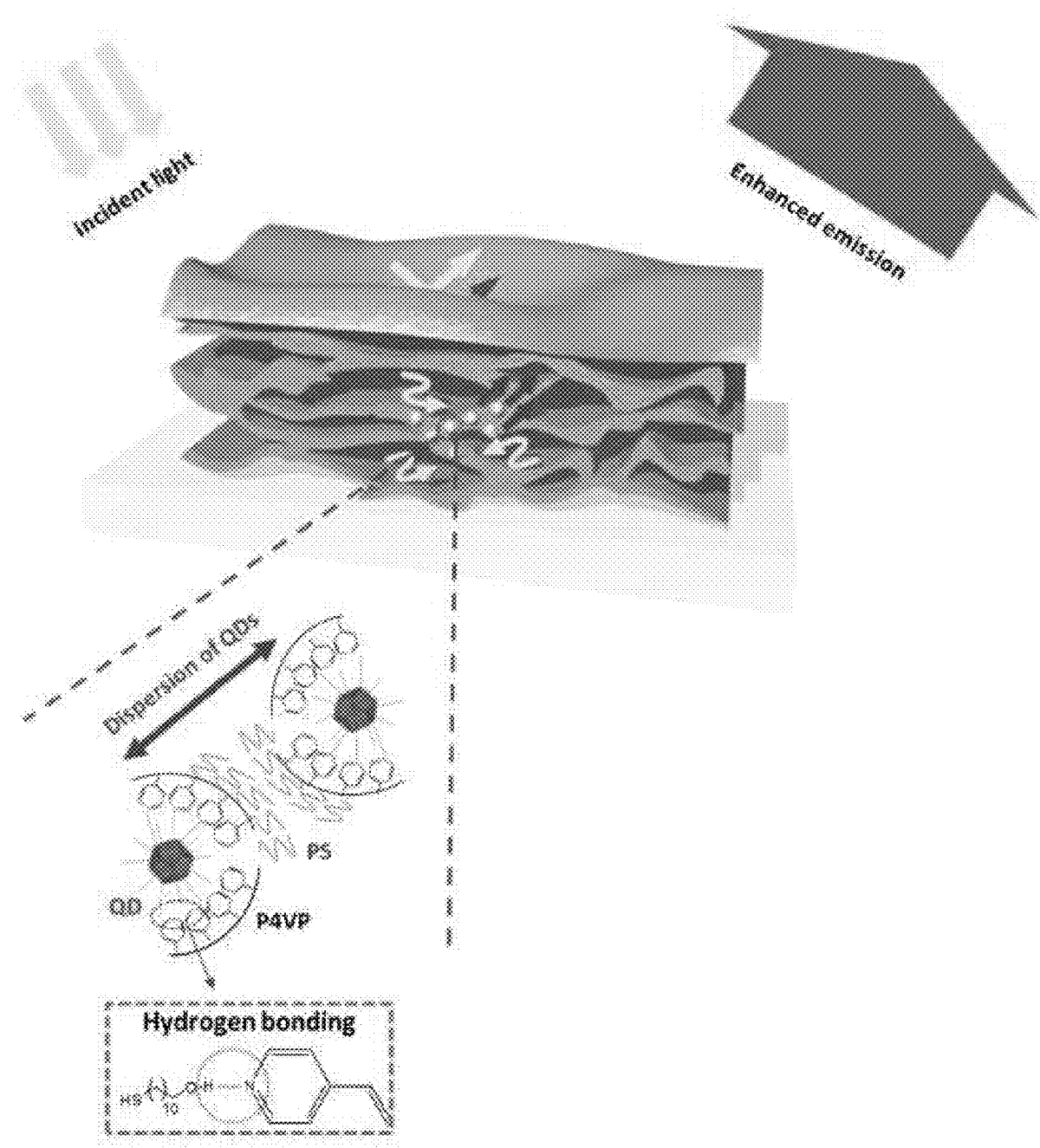
FIG. 1 schematically illustrates a porous structure of a quantum dot film of the present disclosure.
Figure 2:
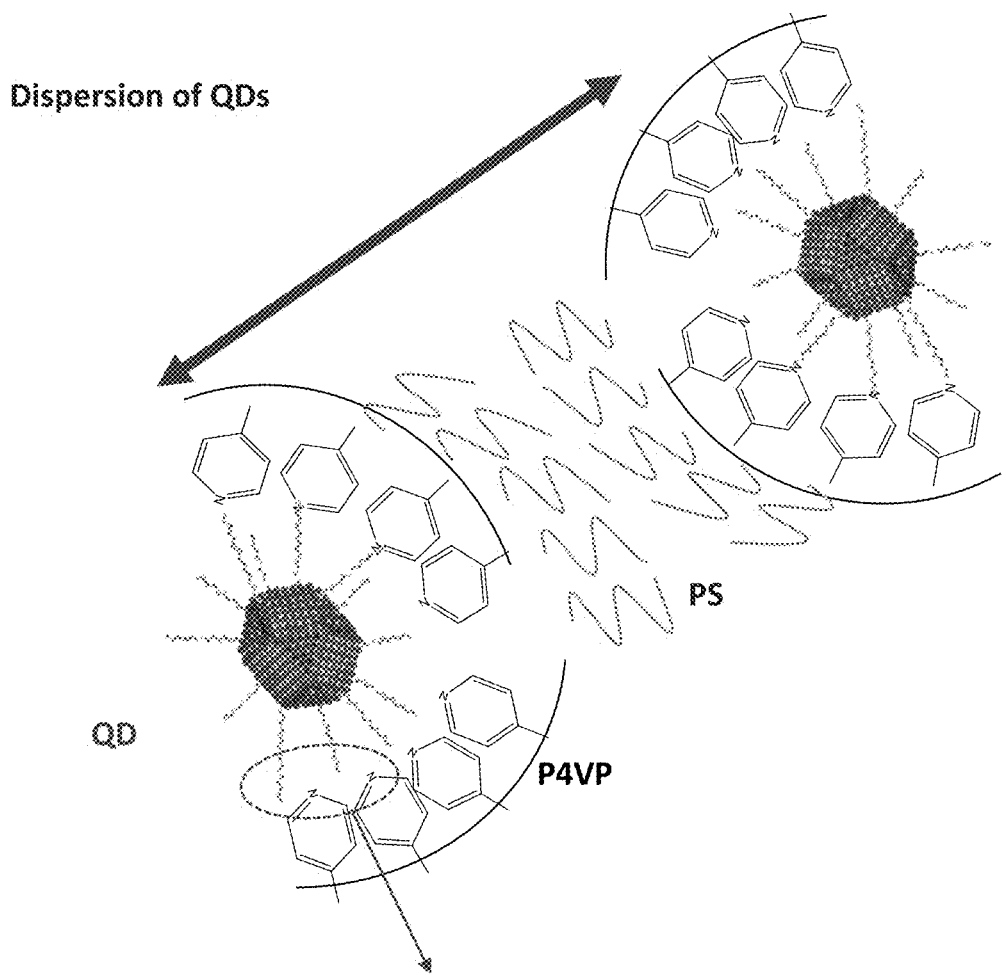
FIG. 2 schematically illustrates selective bonding between a quantum dot and a block copolymer of the present disclosure.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In addition, a term such as a "unit", a "module", a "block" or like, when used in the specification, represents a unit that processes at least one function or operation, and the unit or the like may be implemented by hardware or software or a combination of hardware and software.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Preferred embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the disclosure to those skilled in the art.

The inventors of the present disclosure have made consistent efforts to manufacture a quantum dot film with enhanced quantum dot luminous efficiency. As a result, they have confirmed that a quantum dot-block copolymer film having a porous structure can be prepared through spin-coating of a quantum dot ($CuInS_2$/ZnS)-block copolymer (PS-b-P4VP) mixture solution under controlled humidity and that, as a result of bonding of the block copolymer (PS-b-P4VP) with a porous structure to the quantum dot, the travelling time of incident light is increased due to the pores and quantum dot luminous efficiency is enhanced as the dispersibility of the quantum dot is increased. The present disclosure is based on this finding.

In the present disclosure, the quantum dot film contains: a self-assembled block copolymer; and a quantum dot bonded to the block copolymer.

In the present disclosure, the self-assembled block copolymer may be a self-assembling diblock copolymer dissolved in a solvent.

The self-assembling diblock copolymer may be an amphiphilic diblock copolymer.

The amphiphilic diblock copolymer may be selected from a group consisting of polystyrene-block-poly(4-vinylpyridine) (PS-b-P4VP), polystyrene-block-poly(2-vinylpyridine) (PS-b-P2VP), polystyrene-block-polyethylene oxide (PS-b-PEO), polystyrene-block-polymethyl methacrylate (PS-b-PMMA), polyisoprene-block-poly(2-vinylpyridine)

(PI-b-P2VP), poly(2-vinylpyridine)-block-polydimethylsiloxane (P2VP-b-PDMS) and combinations thereof.

Specifically, it may be polystyrene-block-poly(4-vinylpyridine) (PS-b-P4VP).

The PS-b-P4VP block copolymer is an amphiphilic polymer consisting of a hydrophobic block PS and a hydrophilic block P4VP. The form of the PS-b-P4VP block copolymer may be changed depending on the used solvent and the composition of the block copolymer. Because the two blocks have different solubility properties, the form and self-assembly process of the block copolymer may be different depending on what solvent is chosen.

In the present disclosure, the solvent may be one which selectively dissolves only one of the two blocks contained in the self-assembling diblock copolymer. Specifically, DMF, toluene, etc. may be used, although not being limited thereto.

When a solvent which selectively dissolves one block is used, a micelle with a core-shell structure may be formed as the block with higher solubility forms a corona by being located outside of the micelle and the block with lower solubility is located inside the micelle. In contrast, when a solvent which has good solubility for both blocks of the block copolymer is used, a microstructure in the form of a nanowire is formed through self-assembly instead of forming a micelle.

In an exemplary embodiment of the present disclosure, the self-assembly of polystyrene-block-poly(4-vinylpyridine) is conducted in DMF. When polystyrene-block-poly(4-vinylpyridine) (PS-b-P4VP) is dissolved in the DMF solvent, nanodot and nanowire morphologies may exist together. Although DMF has solubility for both the PS and P4VP blocks, nanodot and nanowire morphologies may exist together because it has slightly higher solubility for one of the two blocks.

The form of the block copolymer may be changed depending on the composition of the block copolymer.

If the PS block and the P4VP block exist at a ratio of 1:1, they mostly self-assemble into nanowires in the DMF solution. However, when the proportion of the PS block is higher, the nanodot morphology may be formed as the self-assembly into micelles becomes dominant.

Specifically, in the present disclosure, a ratio of the molecular weight of the PS block ($M_n^{PS}$) to the P4VP block ($M_n^{P4VP}$) may be lower for P4VP, such as 1:0.12-0.25. Because the P4VP block of the block copolymer is bonded to the quantum dot, the volume ratio actually determining the pattern morphology of the block copolymer may vary depending on the quantum dot. The above-described ration is advantageous in realizing the nanowire morphology of the quantum dot and P4VP pattern morphology and achieving the dispersion of the quantum dot. The porous structure of the block copolymer is formed through phase separation caused by the spinodal decomposition of water, the polymer and the solvent. In this regard, it is preferred that the proportion of the P4VP block having a hydrophilic group is low as in the above-described range.

The quantum dot bonded to the block copolymer consists of a core, a shell and a ligand.

The core is a portion where luminescence occurs and the size of the core determines the emission wavelength. To achieve the quantum confinement effect, the size should be smaller than the exciton Bohr radius and there should be an optical bandgap corresponding to the size. The shell facilitates the quantum confinement effect of the core and determines the stability of the quantum dot. In general, the quantum dot is synthesized with the core/shell form, where the shell prevents oxidation of the core and lowers the trap energy of the core surface, thereby concentrating photons at the core and increasing quantum yield. The ligand serves to improve the dispersibility of the quantum dot and prevent aggregation of the quantum dot.

Specifically, the quantum dot may be one or more selected from a group consisting of CdS, CdSe, CdTe, ZnS, ZnSe, ZnTe, $CuInS_2$, HgS, HgSe, HgTe, CdSeS, CdSeTe, CdSTe, PbSe, PbS, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs. In the present disclosure, the $CuInS_2$/ZnS core-shell quantum dot, which has the three characteristics of low biological toxicity due to the absence of cadmium, superior stability and decreased reabsorption due to large Stokes shift (difference between the band maxima of the absorption and emission spectra), is used as the quantum dot.

In an exemplary embodiment of the present disclosure, the quantum dot core is synthesized from copper iodide, indium acetate, 1-dodecanethiol and 1-octadecene and the quantum dot core-shell ($CuInS_2$/ZnS) is prepared by further reacting with a mixture solution of dodecylamine and zinc acetate.

In the present disclosure, as the quantum dot, any one substituted with a ligand containing an —OH group may be used for hydrogen bonding with the block copolymer (PS-b-P4VP). Typically, the ligand containing an —OH group may be a ligand derived from an alcohol or a carboxylic acid.

Specifically, in the present disclosure, the quantum dot may be one substituted with a ligand containing an —OH group through a reaction with 6-mercaptoundecanol, etc. The quantum dot substituted with a ligand containing an —OH group may be bonded to the nitrogen atom of the P4VP block of the block copolymer.

The quantum dot film of the present disclosure may exhibit remarkably enhanced luminous efficiency by having pores of predetermined size and porosity inside the quantum dot-block copolymer film.

Specifically, the pores may have an average diameter of 100-3000 nm. If the average diameter is smaller than 100 nm or exceeds 3000 nm, the enhancement effect of luminous efficiency may be insignificant due to the light scattering in the visible region.

Specifically, the pores may have a porosity of 10-60% based on the total cross-sectional area. If the porosity is lower than 10%, the enhancement effect of luminous efficiency may be insignificant due to light scattering. And, if it exceeds 60%, the porous structure may not be maintained.

In the present disclosure, the quantum dot film is formed by spin-coating the quantum dot-block copolymer mixture solution on a substrate under a controlled humidity condition. Through this process, pores with an average diameter of 100-3000 nm may be formed in the quantum dot film. For this, the humidity condition is controlled to 30-80% relative humidity. If the relative humidity is lower than 30%, it may be difficult to form the porous structure due to phase separation. And, if it exceeds 80%, a saturated condition for formation of the porous structure may be brought about.

The humidity may be controlled with flow of air consisting of dry air and moist air.

Figure 3:
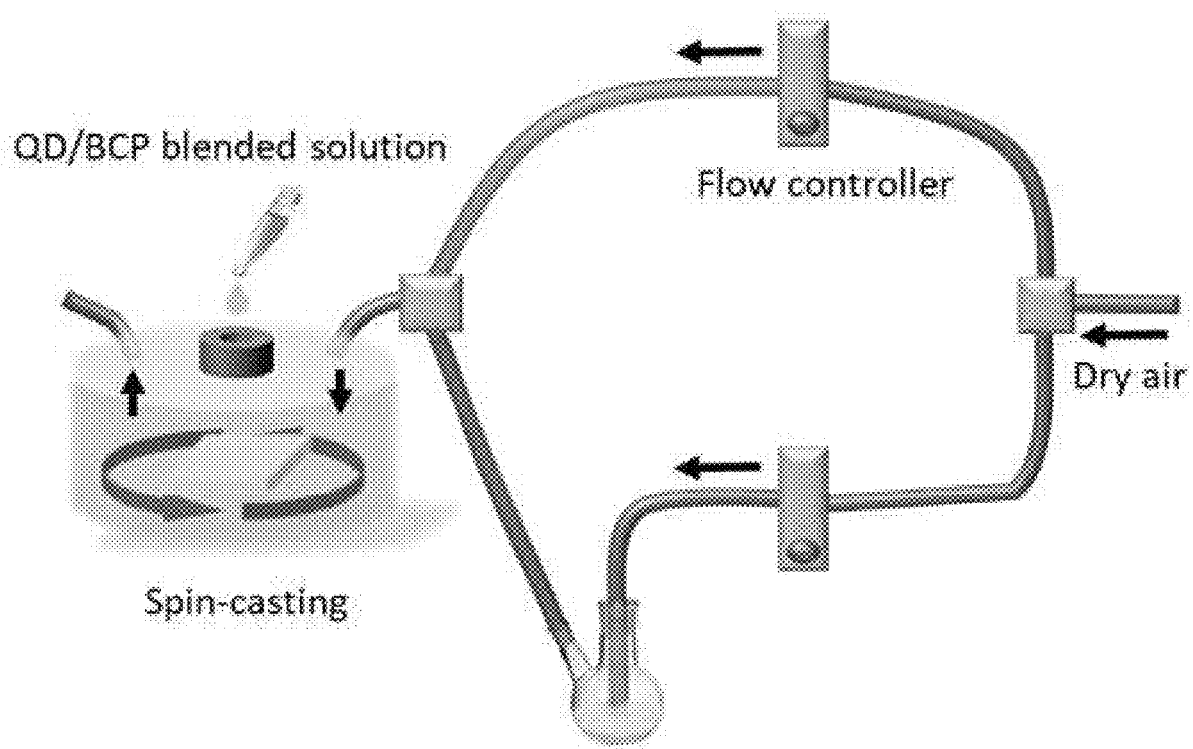
FIG. 3 schematically illustrates an apparatus for manufacturing a quantum dot film having a porous structure of the present disclosure.

In an exemplary embodiment of the present disclosure, an apparatus using moist air and dry air is used to prepare the quantum dot-block copolymer film under a controlled humidity condition, as shown in FIG. 3.

Figure 5:
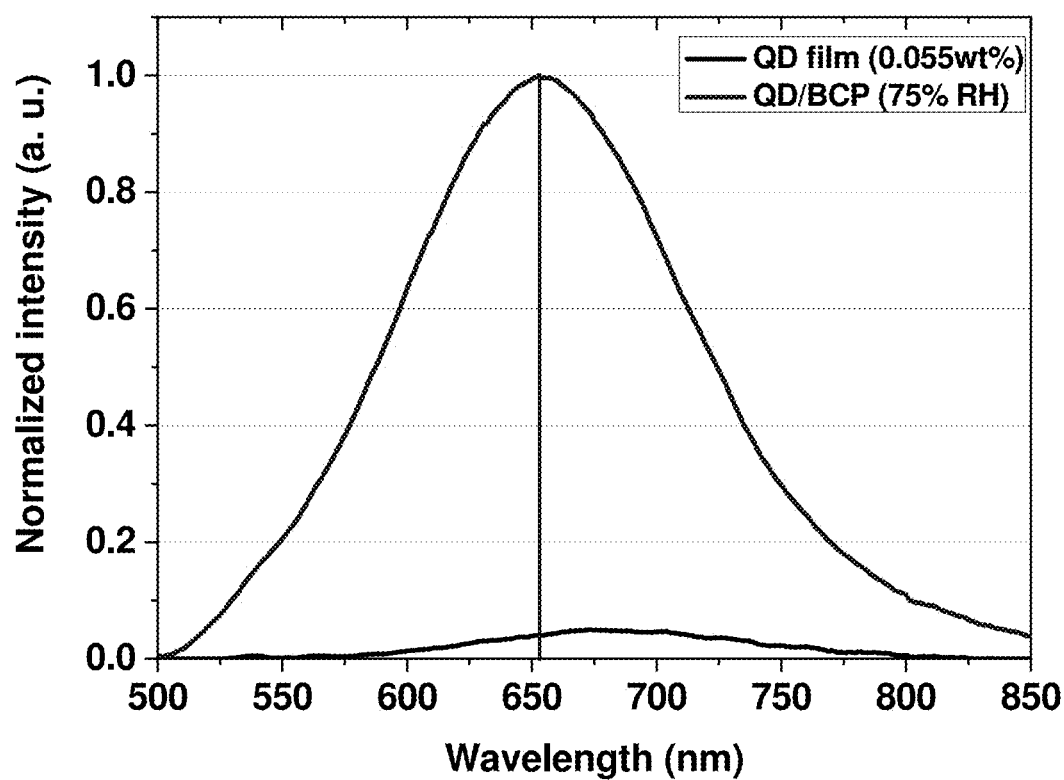
FIG. 5 shows the enhancement of the PL intensity of a quantum dot-block copolymer film (QD/BCP (PS-b-P4VP)) depending on humidity. The film prepared under a 75% relative humidity condition showed about 20-fold enhanced PL intensity at the same QD content. The blue-shift is due to the dispersion of QDs by BCP (PS-b-P4VP).

In an experiment conducted by the inventors of the present disclosure, a quantum dot-block copolymer (QD/PS-b-P4VP) film obtained by spin-coating under a 75% relative humidity condition showed the best-established porous structure and showed 20-fold enhanced intensity as compared to a bare QD film (see FIG. 5).

In the present disclosure, the quantum dot-block copolymer mixture solution contains the quantum dot, the block copolymer and a solvent.

The porous structure block copolymer is formed through phase separation caused by the spinodal decomposition of water, the polymer and the solvent.

For this, the ratio of the quantum dot to the block copolymer may be 1:3-8. If the proportion of the block copolymer is smaller than 3, it may be difficult to form the porous structure through phase separation because the mixture solution becomes hydrophilic. And, if the proportion exceeds 8, the enhancement of luminous efficiency may be insignificant because of the small proportion of the quantum dot.

The solvent may be one having appropriate solubility for the block copolymer and water.

In an exemplary embodiment of the present disclosure, the quantum dot-block copolymer mixture solution (ratio of quantum dot to block copolymer=1:5) is prepared by mixing a quantum dot (CuInS/ZnS), a block copolymer (PS-b-P4VP) and DMF.

The quantum dot film according to the present disclosure may be applied to quantum dot displays, lightings, etc. because it can realize high luminous efficiency and superior color as a quantum dot enhancement film (QDEF).

The present disclosure also provides a quantum dot display containing the quantum dot film.

Hereinafter, the present disclosure will be described in detail through examples. However, the following examples are for illustrative purposes only and it will be apparent to those of ordinary skill in the art that the scope of the present disclosure is not limited by the examples. Therefore, the present disclosure may also be embodied in other forms without being limited to the examples described below.

<Example 1>: Synthesis of Quantum Dot (QD: CuInS$_2$/ZnS)

Copper iodide (38.1 mg), indium acetate (58.4 mg), 1-dodecanethiol (2 mL) and 1-octadecene (16 mL) were mixed and heated at 120° C. for 60 minutes in vacuo (step 1). A quantum dot core was synthesized by heating the solution at 210° C. for 70 minutes under a 1 atm argon atmosphere (step 2). While maintaining the temperature at 210° C., a mixture solution of dodecylamine (1.0 mL) and zinc acetate (131.7 mg) was injected to the solution under a 1 atm argon atmosphere (step 3). A quantum dot core-shell was synthesized by repeating the procedure of the step 3 for 4 times with 30-minute intervals.

<Example 2>: Substitution with Ligand (Ligand: 6-Mercaptoundecanol)

While maintaining the temperature at 210° C., 6-mercaptoundecanol (1.634 g) was injected to the solution containing the quantum dot core-shell prepared in Example 1 under a 1 atm argon atmosphere (step 1). After conducting ligand substitution by reacting for 30 minutes, the reaction was completed by cooling to room temperature (step 2). Upon completion of the reaction, the solution, hexane, chloroform and ethanol were mixed at a ratio of 1:4:0.5:0.5 and the quantum dot was separated from organic materials (including unsubstituted and detached ligand) by centrifuging at 6,000 rpm for 5 minutes (step 3). A ligand-substituted quantum dot was obtained by repeating the procedure of the step 3 twice.

<Example 3>: Preparation of Quantum Dot-Block Copolymer Mixture Solution

A self-assembled block copolymer solution was prepared by mixing polystyrene-block-4-vinylpyridine (PS-b-P4VP, $M_n^{PS}$=12,000 g/mol, $M_n^{P4vp}$=1,700 g/mol, $M_w/M_n$=1.09, $f_{PS}$=88%, $f_{P4VP}$=12%; Polymer Source) in DMF at room temperature for about 30 minutes.

A quantum dot-block copolymer mixture solution was prepared by mixing the block copolymer solution with a solution of the ligand-substituted quantum dot of Example 2 dissolved in DMF. The ratio of the quantum dot to the block copolymer in the mixture solution was set to 1:5. For hydrogen bonding between the quantum dot and the block copolymer, reaction was conducted at 500 rpm for at least 3 hours using a magnetic stirring bar. Upon completion of the reaction, the quantum dot-block copolymer mixture solution was sealed with paratape to prevent reaction with the air in the atmosphere and then stored in a refrigerator.

<Example 4>: Preparation of Quantum Dot-Block Copolymer Film

A quantum dot-block copolymer film was prepared by spin coating using an apparatus using moist air and dry air shown in FIG. 3 for humidity control.

First, after cutting a silicon wafer or an optical slide glass to a desired dimension, ultrasonication was conducted for 1 hour with a washing solution consisting of acetone and ethanol (1:1). The washed silicon wafer or optical slide glass was subjected to UV-ozone treatment for 15 minutes to remove organic materials (impurities). The prepared silicon wafer or optical slide glass was loaded onto a spin coater and kept for 8 minutes while controlling the volume flow from the moist air and dry air sides to be 1000 cc. When the desired relative humidity (75%) was reached, the cover of the spin coater was opened and the quantum dot-block copolymer mixture solution prepared in Example 3 was put in. A quantum dot-block copolymer film was obtained by conducting spin coating at 2000 rpm for 100-200 seconds.

The following experiments were conducted for the prepared quantum dot-block copolymer film.

Figure 4:
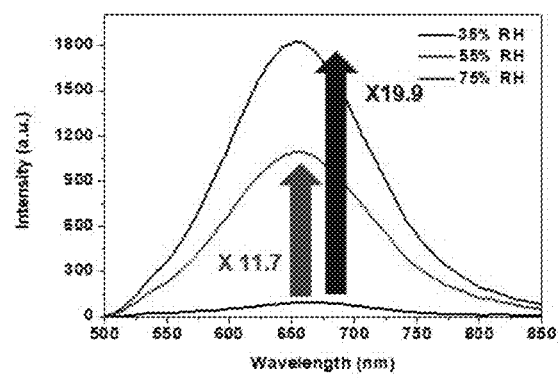
FIG. 4 shows the change in morphology and luminous efficiency depending on humidity control during spin coating using a quantum dot-block copolymer solution.
Figure 4:
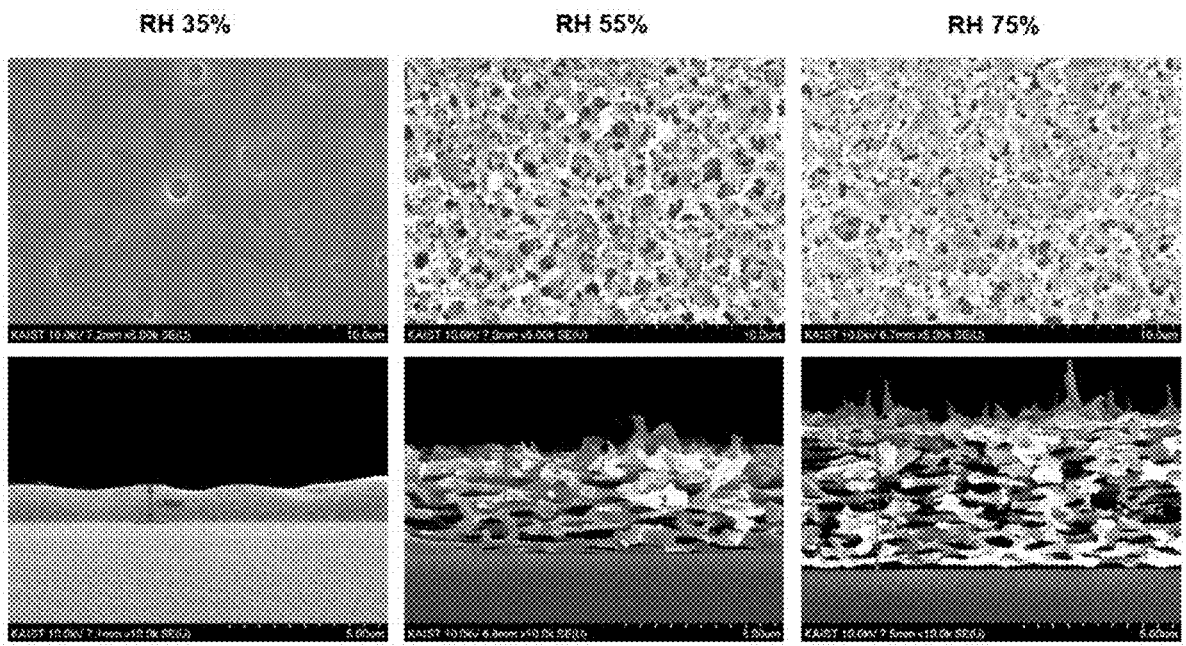

<Test Example 1>: Change in Form and Luminous Efficiency of Quantum Dot-Block Copolymer Film (QD/BCP (PS-b-P4VP) Depending on Humidity Control During Spin Coating For the quantum dot-block copolymer film of Example 4 and quantum dot-block copolymer films prepared in the same manner as in Example 4 by changing relative humidity to 35% and 55%, luminescence intensity was analyzed using a fluorescence spectrometer at an excitation wavelength of 450 nm. Also, the cross section was analyzed by SEM. FIG. 4 shows the change in morphology and luminous efficiency depending on humidity control during the spin coating.

<Test Example 2>: Intensity Enhancement Effect of Quantum Dot-Block Copolymer Film (QD/BCP (PS-b-P4VP)) as Compared to Quantum Dot Film Depending on Humidity Control As a control group, a quantum dot film (bare QD film) was prepared through drop coating of a quantum dot solution containing 0.055 wt % QD only in a DMF solvent. As a test group, a quantum dot-block copolymer film prepared in the same manner as in Example 4 at a relative humidity of 75% was used. A result of comparing their intensity is shown in FIG. 5. As seen from FIG. 5, it was confirmed from measurement with an inductively coupled plasma mass spectrometer that the BCP-containing QD film (test group) prepared under a 75% relative humidity condition has the same QD content (0.055 wt %) as the bare QD film (control group). The PL intensity was increased about 20-fold. The blue-shift is due to the dispersion of QDs by BCP.

<Test Example 3>: Intensity Enhancement Effect of Quantum Dot-Block Copolymer Film as Compared to Homopolymer In order to confirm the intensity enhancement effect of the quantum dot-block copolymer film of Example 4, quantum dot-homopolymer films containing two homopolymers (PS and P4VP) instead of the block copolymer were prepared under a 75% relative humidity condition, as a control group. For the two quantum dot-homopolymer films (QD/PS and QD/P4VP) and the quantum dot-block copolymer (QD/BCP) film of Example 4, luminescence intensity was analyzed using a fluorescence spectrometer at an excitation wavelength of 450 nm and the cross section was analyzed by SEM. The result is shown in FIG. 6.

Figure 6:
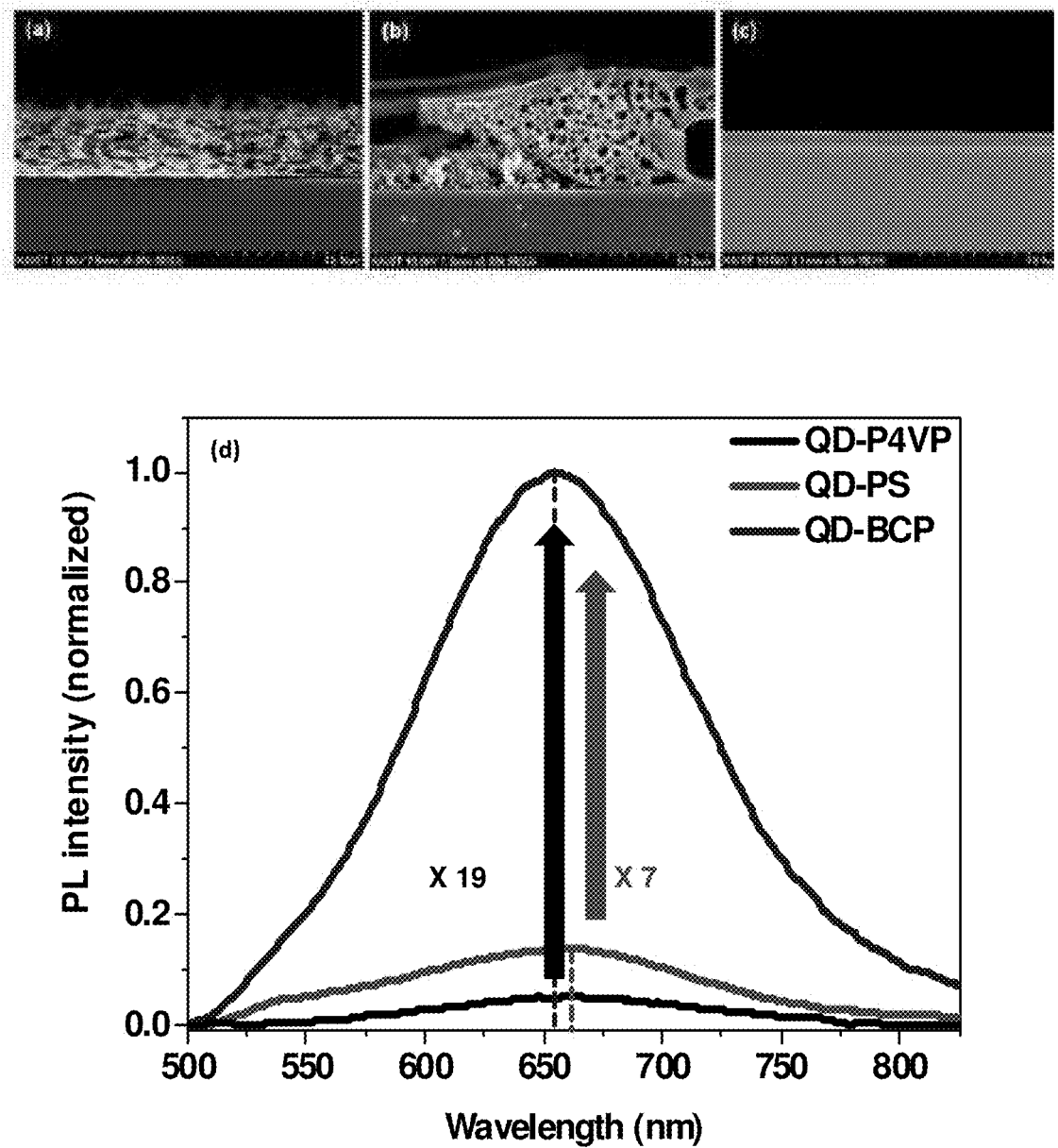
FIG. 6 shows the SEM images of (a) QD/BCP (PS-b-P4VP), (b) QD/PS and (c) QD/P4VP films under a 75% relative humidity condition and (d) shows the PL spectra of (a), (b) and (c). Among the three polymer materials, the block copolymer showed the best formation of a porous structure capable of maximizing light scattering effect and also showed the highest PL intensity.

FIG. 6 shows the SEM images of (a) QD/BCP (PS-b-P4VP), (b) QD/PS and (c) QD/P4VP films under a 75% relative humidity condition and (d) shows the PL spectra of (a), (b) and (c).

Referring to FIG. 6, it can be seen that the porous structure capable of maximizing light scattering effect was formed best when the diblock copolymer BCP was used during the spin coating (a) and the highest PL intensity was also the highest. From this, it can be seen that the quantum dot film of the present disclosure has the optimized porous structure for enhancing the QD luminous efficiency.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A quantum dot film comprising:
    a self-assembled block copolymer; and
    a quantum dot bonded to the block copolymer,
    wherein the block copolymer forms porous structure through phase separation caused by the spinodal decomposition of water, the block copolymer and solvent, and the ratio of the quantum dot to the block copolymer is 1:3-8,
    wherein the quantum dot film has pores with an average diameter of 100-3000 nm and the quantum dot is substituted with a ligand containing an —OH group.

2. The quantum dot film of claim 1, wherein the self-assembled block copolymer is an amphiphilic diblock copolymer.

3. The quantum dot film of claim 1, wherein the self-assembled block copolymer is polystyrene-block-poly(4-vinylpyridine) (PS-b-P4VP).

4. The quantum dot film of claim 1, wherein the quantum dot is a $CuInS_2$/ZnS core-shell structure.

5. The quantum dot film of claim 1, wherein the pores are provided in the film by spin-coating a quantum dot-block copolymer mixture solution under a controlled humidity condition.

6. The quantum dot film of claim 5, wherein the humidity condition is 30-80% relative humidity.

7. A quantum dot display comprising the quantum dot film of claim 1.

8. A quantum dot film comprising:
    a self-assembled block copolymer;
    a quantum dot bonded to the block copolymer, and
    a hydrogen bond bonding the block copolymer and the quantum dot,
    wherein the block copolymer forms porous structure through phase separation caused by the spinodal decomposition of water, the block copolymer and solvent, and the ratio of the quantum dot to the block copolymer is 1:3-8,
    wherein the quantum dot is substituted with a ligand containing an —OH group.

9. The quantum dot film of claim 8, wherein the film has pores with an average diameter of 100-3000 nm.

10. The quantum dot film of claim 8, wherein the self-assembled block copolymer is an amphiphilic diblock copolymer.

11. The quantum dot film of claim 8, wherein the self-assembled block copolymer is polystyrene-block-poly(4-vinylpyridine) (PS-b-P4VP).

12. The quantum dot film of claim 8, wherein the quantum dot is a $CuInS_2$/ZnS core-shell structure.

13. The quantum dot film of claim 8, wherein the pores are provided in the film by spin-coating a quantum dot-block copolymer mixture solution under a controlled humidity condition.

14. The quantum dot film of claim 13, wherein the humidity condition is 30-80% relative humidity.

* * * * *